United States Patent [19]

Kodama et al.

[11] 3,922,566

[45] Nov. 25, 1975

[54] DYNAMIC BINARY COUNTER CIRCUIT

[75] Inventors: Yukuo Kodama; Tsuyoshi Ando, both of Tokyo, Japan

[73] Assignee: Nippon Electric Co., Inc., Tokyo, Japan

[22] Filed: July 16, 1974

[21] Appl. No.: 488,997

[30] Foreign Application Priority Data

July 24, 1973 Japan .............................. 48-83749

[52] U.S. Cl. ...... 307/220 C; 307/221 C; 307/225 C

[51] Int. Cl.² .......................................... H03K 23/8

[58] Field of Search ......... 307/220 C, 221 C, 225 C

[56] References Cited

UNITED STATES PATENTS 3,742,248 6/1973 Eaton, Jr. ........................ 307/225 C

*Primary Examiner*—John Kominski

*Attorney, Agent, or Firm*—Hopgood, Calimafde, Kalil, Blaustein & Lieberman

[57] ABSTRACT

A dynamic binary counter circuit adapted for integrated circuit construction is characterized by minimal component count, high speed operation and low power dissipation. The counter arrangement includes an inverter, alternately enabled controlled switching elements connected in cascade between inverter input and output terminals, and first and second capacitors respectively connected at the inverter input, and at the switch junction.

7 Claims, 5 Drawing Figures

DYNAMIC BINARY COUNTER CIRCUIT

DISCLOSURE OF THE INVENTION

This invention relates to electronic circuitry and, more particularly to a dynamic binary counter formed of a minimum number of constituent components.

As generally known, many prior art binary counter circuits employ static and dynamic flip-flops. The static flip-flops require a considerable number of components and hence are unsuited for integrated circuit construction where the number of components per function must be kept to a minimum. Furthermore, in a static flip-flop, the maximum thermal loss is large, thus obviating utility for such flip-flops in high speed applications.

From this speed standpoint, a dynamic flip-flop is more practical in the design of faster, high-density integrated circuits. However, most prior art dynamic flip-flop arrangements have required at least two inverters and two switching elements.

With the rapid recent development of IC technology, a reduction in the number of circuit elements used in flip-flops and an increase in circuit operating speed have become increasing needs for integrated circuit users.

It is, therefore, an object of the invention to provide a dynamic binary counter circuit which employs a number of minimal components.

It is another object of the invention to provide a dynamic binary counter circuit capable of high speed operation.

The above and other objects of the instant invention are realized in a dynamic binary counter circuit comprising: an inverter; first and second switching elements connected in cascade between the input and output terminals of the inverter; a capacitor having one end connected to the input terminal of the inverter; and another capacitor having one end connected between the first and second switching elements; wherein the first and second switching elements are alternately turned on and off.

The active element best suited for the purposes of the present invention is the insulated-gate field effect transistor. The invention is not limited to such transistors, however, and other transistors of a type having input and output electrodes and a control electrode, in which the presence of a conduction channel between the input and output electrodes is controlled by the voltage applied to the control electrode may be employed. These insulated-gate field effect transistors are classified as P-channel type transistors, viz., transistors of P-conductivity type, or N-channel (N-conductivity) type transistors. The majority carriers in the P-channel devices are positive holes; while the majority carrier for the N-channel transistors are electrons.

In the insulated-gate field effect transistors, the gate region (i.e., the control electrode) has a capacitance which depends on the relationship between the thickness of the insulation layer of the conduction channel and the size of the conduction channel formed between the source (i.e., the input electrode) and the drain (i.e., the output electrode). Typically, the capacitance may be of the order of several picofarads. The value of the input impedance, i.e., the gate-to-source or gate-to-drain impedance is very high, in the range of approximately $10^{12}$ to $10^{14}$ ohms. In other words, the product of the input resistance and input capacitance at the gate is on the order of several tens of seconds, which makes "memory" available for a period of time. Thus, the gate region of such a transistor can retain information even if the power source is cut off for limited time intervals, and is then again turned on. This makes it possible to realize a circuit system, called dynamic logic, which consumes very little power. According to the invention, this gate capacitance is utilized as a temporary memory as will be described in connection with a circuit utilizing MOS transistors, which are typical of insulated-gate field effect devices.

The objects, features and advantages of the present invention will become more apparent from the following detailed description of specific illustrative embodiments thereof, presented herein below in conjunction with the accompanying drawings, in which.

Figure 1:
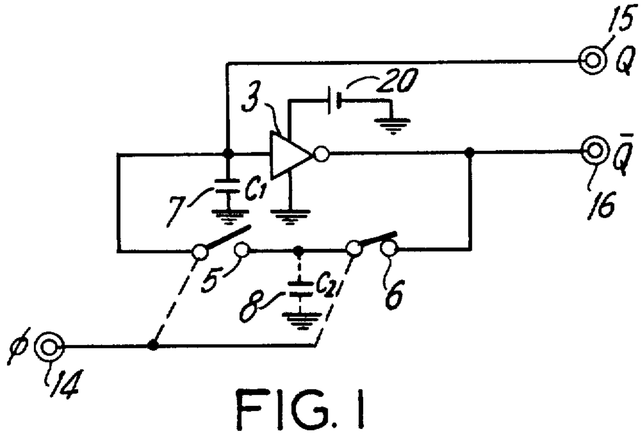
FIG. 1 is a block diagram illustrating the fundamental principles of a binary counter circuit realized according to the present invention.

Referring now to FIG. 1, there is shown in block diagram form a binary counter circuit embodying the principles of the invention. The counter includes an inverter 3 having an input terminal 15 and an output terminal 16. The inverter 3 is supplied with voltage from a power source 20. Two switching elements 5 and 6 are serially connected between the input and output terminals of the inverter 3. The input terminal 15 serves as one output (Q) terminal of the binary counter circuit, and the inverter output terminal 16 comprises the other counter output ($\bar{Q}$) terminal.

A capacitor 7 (of capacitance $C_1$) indicated by a dotted line is present as a practical matter at the input port of the inverter 3, and a capacitor 8 (of capacitance $C_2$) indicated by dotted line in FIG. 1 exists between the switching elements 5 and 6. These capacitive elements are of distributed rather than of lumped constant form. The capacitor 7 represents the capacitance at the input of the inverter 3 and the capacitance at the output of the switching element 5, together with the stray capacitance attendant to the lines connecting the inverter 3 to the switching element 5 and to the terminal 15. The capacitor 8 incorporates the capacitance at the output of the switching element 6, on the input of the switching element 5, the stray capacitance associated with the line formed when the two switching elements are connected to each other, and that attendant to the line connected to the output terminal 16. The capacitors 7 and 8 have one end grounded at a terminal common to other components. When the switching elements are MOS transistor, it is desirable to use distributed capacitance for the capacitors 7 and 8. However, when the switching elements are not MOS transistor, lumped capacitors may be used in place of distributed capacitances.

The switching elements 5 and 6 always assume mutually opposite states. That is, the switch 6 is in the off state when the switch 5 is on, and vice versa. These switching elements are controlled by a clock pulse wave $\phi$ applied to an input terminal 14 of the compositive binary counter circuit.

Assume that the switch 5 turns on responsive to a positive clock pulse potential (hereinafter referred to as the H level), and that the switch 6 is turned on by the clock pulse at ground potential (hereinafter referred to as the L level). An N-channel MOS transistor is then suitable for the switching element 5, and a P-channel MOS transistor is suitable for the switch 6.

Figure 2:
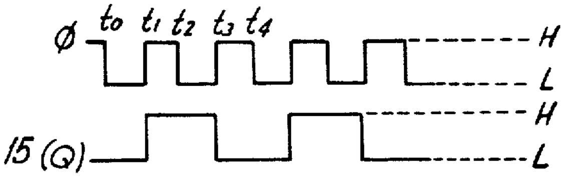
FIG. 2 is a waveform diagram characterizing operation of the circuit shown in FIG. 1.

FIG. 2 is a waveform diagram characterizing the operation of the circuit as shown in FIG. 1. Assume that a clock pulse wave $\phi$ is applied to the counter input terminal 14. The switch element 6 is then on and the switch 5 is off for the period between $t_0$ and $t_1$ during which period the clock pulse wave is at its L level (or 0 volts). When this condition obtains the state of the output 16 of the inverter 3 (i.e. the state present before $t_0$, or the state established immediately after the power source is turned on) is stored in the capacitor 8 ($C_2$) through the switch means 6. (This state is herein considered to be the H level, or V volts). In other words, the capacitor 8 is charged to the voltage V. The state of the flip-flop for the period between $t_0$ and $t_1$ is such that the output (Q) 15 stands at the L level (0 volts) and the output ($\bar{Q}$) 16 exhibits its H level (V volts) when the clock pulse $\phi$ is at the L level (0 volts).

For the period between $t_1$ and $t_2$ the clock pulse $\phi$ assumes the H level (V volts), turning switch 5 on and the switch 6 off. The information stored in the capacitor 8 is thereby transferred to the other capacitor 7 ($C_1$) by way of the now closed switch 5. Assuming that the capacitance $C_2$ is greater than $C_1$, most of the voltage stored in the capacitor 8 is applied across the capacitor 7 and thereby also the input of the inverter 3. As well known, the inverter assumes one state (e.g., the L level) at its output and the other state (e.g., the H level) at its input.

Accordingly, the state of the flip-flop for the period between $t_1$ and $t_2$ is such that the output (Q) 15 is at the H level (V volts), and the other output (Q) 16 is at the L level (0 volts) when the clock pulse $\phi$ is at the H level (V volts). This flip-flop state is opposite to that obtained during the interval $t_0$–$t_1$.

For the period between $t_2$ and $t_3$, the clock pulse $\phi$ is low, turning the switch 6 on and the switch 5 off. Because the low L level is present at the output 16 (i.e., the output of the inverter 3) at and following time $t_2$, the capacitor 8 is discharged to ground potential through the low output impedance of the inverter 3, thus transferring the low state binary information present at the output terminal 16 to the capacitor 8. The state of the flip-flop for the period between $t_2$ and $t_3$ is then such that the Q-output 15 is high, and the $\bar{Q}$-output 16 is low when the clock pulse $\phi$ is low. The outputs 15 and 16 of the circuit therefore remain in the condition present during $t_1$–$t_2$.

For the period between $t_3$ and $t_4$, the clock pulse is high (V volts), such that the switch 5 is on and the switch 6 is off. Accordingly, the capacitors 7 and 8 ($C_1$ and $C_2$) are again connected in parallel through the switch 5. The charge initially across the capacitor 7 is absorbed by the discharged capacitor 8. Since $C_2$ exceeds $C_1$ substantially, there is very little net voltage across the shunt-connected capacitors 7 and 8, thus effectively applying a low potential to the input of the inverter 3. Then, the binary information state (0 volts) stored in the capacitor 8 is transferred to the capacitor 7 by way of the closed switch 5 and impressed at the input to the inverter 3. The inverter output ($\bar{Q}$) 16 is therefore inverted to the high level. The state of the flip-flop for the period between $t_3$ and $t_4$ is then such that the output (Q) 15 stands at the L level (0 volts), and the output ($\bar{Q}$) 16 stands at the L level (V volts) when the clock pulse $\phi$ is at the H level (V volts).

It will be evident from FIG. 2 that two clock pulse cycles are needed to effect one cycle at the output (Q) 15, thereby performing the binary counter operational function. The binary counter circuit as described above can readily perform the above described operations, switching states when the switching threshold voltage link of the inverter 3 and switch elements 5 and 6 are exceeded even before such potentials reach the L or H levels.

Figure 3:
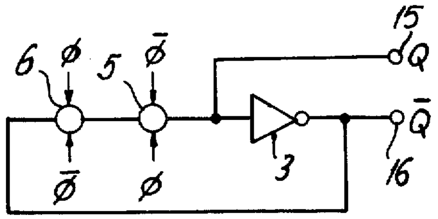
FIG. 3 is a block diagram showing a first illustrative embodiment of the present invention.
Figure 4:
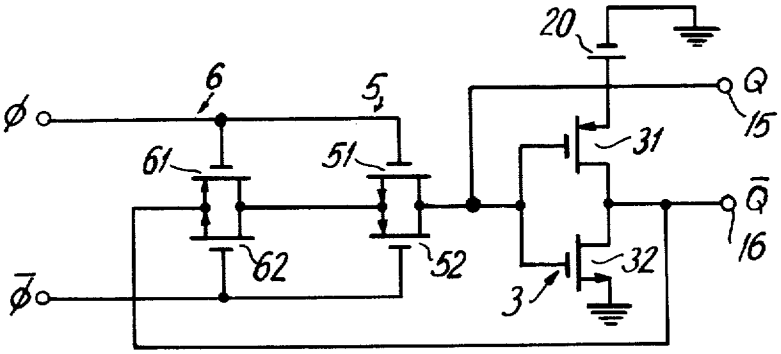
FIG. 4 is a circuit diagram showing one aspect of the embodiment as in FIG. 3, in detail.

One specific embodiment of the present invention will now be described with reference to FIGS. 3 and 4. FIG. 3 is a block diagram showing a circuit operated by two-phase clock, and FIG. 4 schematically illustrates a concrete circuit of the FIG. 3 type. Identical reference numerals denote like components throughout FIGS. 1, 3 and 4. The switch elements 5 and 6 are transmission gates, each comprising a pair of P- and N-channel MOS transistors. The switch 5 comprises an N-channel MOS transistor 51 and a P-channel MOS transistor 52. The transistor 51 has its drain connected to the source of the transistor 52, and its source connected to the drain of the transistor 52.

Clock pulses $\phi$ and $\bar{\phi}$ with polarities opposite to each other are respectively connected to the gates of the transistors 51 and 52, to control the switch 5. The switch element 6 comprises a P-channel MOS transistor 61 and an N-channel MOS transistor 62. The transistor 61 has its source connected to the drain of the transistor 62, and its drain connected to the source of the transistor 62. Clock pulses $\phi$ and $\bar{\phi}$ of opposite polarities are connected to the gates of the transistors 61 and 62 to control conduction in these devices. When a clock pulse $\phi$ of H level is applied to the gate of the transistor 51 and a clock pulse $\bar{\phi}$ of L level is applied to the gate of the transistor 52, the switch 5 exhibits a large bidirectional conductivity. Conversely, when the clock pulse $\phi$ is low and the clock pulse $\bar{\phi}$ is high, the switch 5 does not conduct. The switch 6 exhibits a conductivity characteristic inverse frome the switch 5 since the clock pulse $\phi$ is connected to the gate of the P-channel MOS transistor 61, and the clock pulse $\bar{\phi}$ is connected to the gate of the N-channel MOS transistor 62. Thus these switching elements perform the same functions as the elements 5 and 6 shown in FIG. 1.

The inverter 3 comprises a P-channel MOS transistor 31 and an N-channel MOS transistor 32, the transistor 31 having its source connected to the drain of the transistor 32, and its gate connected to the gate of the transistor 32. One output $\bar{Q}$ of the circuit is derived from the junction between the source of the transistor 31 and the drain of the transistor 32, i.e., from the output terminal 16 of the inverter 3, and the other output Q is derived from the junction between the gates of the transistors 31 and 32, i.e., from the input terminal of the inverter 3. The drain of the transistor 31 and the source of the transistor 32 are respectively connected to the highest and lowest potentials of the power source 20. This dynamic binary counter circuit operates in the same manner as the circuit illustrated in FIGS. 1 and 2, and above discussed.

Figure 5:
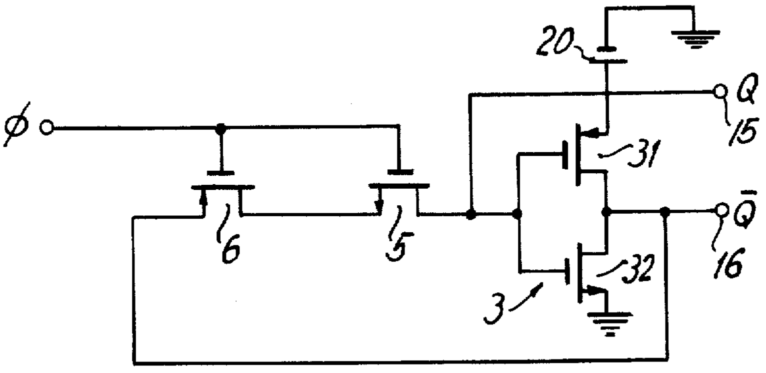
FIG. 5 is a circuit diagram showing a second illustrative embodiment of the present invention.

FIG. 5 is a circuit diagram showing another embodiment of the invention operated by a single phase clock signal. Identical reference numerals denote like components in FIGS. 1, 4 and 5. The switches 5 and 6 comprise an N-channel MOS transistor and a P-channel MOS transistor, respectively. A clock pulse $\phi$ is applied to the gates of these transistors. The inverter 3 is the same as that of the FIG. 4 embodiment, comprising a P-channel MOS transistor 31 and an N-channel MOS transistor 32. This FIG. 5 dynamic binary counter circuit operates in the same manner as the circuit illustrated in FIGS. 1 and 2.

The dynamic binary counter circuit of this invention requires very few constituent components, that is, six components for two-phase clock operation, and four components for single phase clock operation. This makes it feasible to save on required power, reduce the required chip area on an integrated circuit, and increase yield. Furthermore according to the present invention, one single inverter suffices for the dynamic binary counter circuit, with the result that operating speed is increased and the operation frequency characteristic is improved.

While several preferred embodiments of the instant invention have been illustrated and described in detail, it is to be understood that the invention is not limited thereto or thereby. Numerous modifications and adaptations thereof will be readily apparent to those skilled in the art without departing from the spirit and scope of the present invention.

What is claimed is:

1. A dynamic binary counter circuit comprising inverter means having an input terminal and an output terminal, first switching means and second switching means connected in cascade between said input terminal and said output terminal of said inverter means, a first capacitor connected to said input terminal of said inverter means, a second capacitor connected between said first switching means and said second switching means, the capacitance of said second capacitor being greater than the capacitance of said first capacitor, and control means for alternately turning said first and second switching means on and off.

2. A dynamic binary counter circuit as claimed in claim 1, wherein said first switching means comprises a first transistor of one conductivity type, and said second switching means comprises a second transistor of the opposite conductivity type, said first and second transistors each having an input electrode, an output electrode and a control electrode, said input electrode of said first transistor being connected to said output electrode of said second transistor, said output electrode of said first transistor being connected to said input terminal of said inverter means, said input electrode of said second transistor being connected to said output terminal of said inverter means, wherein said control means includes means for applying a clock pulse to said control electrodes of said first and second transistors.

3. A dynamic binary counter circuit as claimed in claim 2, wherein said inverter means comprises a third transistor of said one conductivity type, and a fourth transistor of the opposite conductivity, said third and fourth transistors each having an input electrode, an output electrode and a control electrode, said input electrode of said third transistor and said output electrode of said fourth transistor being connected to said output terminal of said inverter means, a power source, said output electrode of said third transistor being connected to one end of a said power source, said input electrode of said fourth transistor being connected to the other end of said power source, and said control electrodes of said third and fourth transistors being connected in common to said input terminal of said inverter means.

4. A dynamic binary counter circuit as claimed in claim 3, wherein the transistors comprise insulated-gate field effect transistors.

5. A dynamic binary counter circuit comprising inverter means having an input terminal and an output terminal;

first switching means having a first transistor of one conductivity type, a second transistor of the reverse conductivity type, a first terminal and a second terminal, said first and second transistors each having an input electrode, an output electrode and a control electrode, said input electrode of said first transistor and said output electrode of said second transistor being connected in common to said first terminal, said output electrode of said first transistor and said input electrode of said second transistor being connected in common to said second terminal;

second switching means having a third transistor of said one conductivity type, a fourth transistor of the opposite conductivity type, a third terminal and a fourth terminal, said third and fourth transistors each having an input electrode, an output electrode and a control electrode, said input electrode of said third transistor and said out electrode of said fourth transistor being connected in common to said third terminal, said output electrode of said third transistor and said input electrode of said fourth transistor being connected in common to said fourth terminal, said first terminal being connected to said input terminal of said inverter means, said fourth terminal being connected to said output terminal of said inverter means, said second and third terminals being connected in common; a first capacitance means connected to said input terminal of said inverter means;

a second capacitance means connected between said first switching means and said second switching means;

control means including means for applying a first clock pulse to said control electrodes of said first and fourth transistors and means for applying a second clock pulse opposite in polarity to said first clock pulse to said control electrodes of said second and third transistors.

6. A dynamic binary counter circuit as claimed in claim 5, wherein said inverter means comprises a fifth transistor of said one conductivity type and a sixth transistor of the opposite conductivity type, said fifth and sixth transistors each having an input electrode, an output electrode and a control electrode, said input electrode of said fifth transistor and said output electrode of said sixth transistor being connected to said output terminal of said inverter means, a power source, said output electrode of said fifth transistor being connected to one end of said power source, said input electrode of said sixth transistor being connected to the other end of said power source, and said control electrodes of said fifth and sixth transistors being connected in common to said input terminal of said inverter means.

7. A dynamic binary counter circuit as claimed in claim 6, wherein the transistors are insulated-gate field effect transistors.

* * * * *

UNITED STATES PATENT OFFICE

CERTIFICATE OF CORRECTION

Patent No. 3,922,566 Dated November 25, 1975

Inventor(s) Yukuo Kodama and Tsuyoshi Ando

It is certified that error appears in the above-identified patent and that said Letters Patent are hereby corrected as shown below:

The assignee's name should read:

--NIPPON ELECTRIC COMPANY, LIMITED--.

Signed and Sealed this

Thirteenth Day of July 1976

[SEAL]

*Attest:*

RUTH C. MASON
*Attesting Officer*

C. MARSHALL DANN
*Commissioner of Patents and Trademarks*